(12) United States Patent
Yamaguchi et al.

(10) Patent No.: US 12,050,398 B2
(45) Date of Patent: Jul. 30, 2024

(54) SEMICONDUCTOR DEVICE AND METHOD OF FORMING THE SAME

(71) Applicant: MICRON TECHNOLOGY, INC., Boise, ID (US)

(72) Inventors: Hidenori Yamaguchi, Higashihiroshima (JP); Keizo Kawakita, Higashihiroshima (JP); Shigeru Sugioka, Higashihiroshima (JP)

(73) Assignee: MICRON TECHNOLOGY, INC., Boise, ID (US)

(*) Notice: Subject to any disclaimer, the term of this patent is extended or adjusted under 35 U.S.C. 154(b) by 567 days.

(21) Appl. No.: 16/878,508

(22) Filed: May 19, 2020

(65) Prior Publication Data
US 2021/0364911 A1     Nov. 25, 2021

(51) Int. Cl.
*G03F 1/56* (2012.01)
*H01L 21/027* (2006.01)
*H01L 23/31* (2006.01)

(52) U.S. Cl.
CPC ............ *G03F 1/56* (2013.01); *H01L 21/0273* (2013.01); *H01L 23/3171* (2013.01); *H01L 23/3178* (2013.01); *H01L 23/3192* (2013.01); *H01L 2224/0215* (2013.01); *H01L 2224/05569* (2013.01)

(58) Field of Classification Search
CPC ....... H01L 2224/05569; H01L 2224/023–024; H01L 21/02118–0212; H01L 21/0271–0279
See application file for complete search history.

(56) References Cited

U.S. PATENT DOCUMENTS

| | | | |
|---|---|---|---|
| 2002/0105040 A1* | 8/2002 | Yamazaki | H01L 29/78678 257/E21.414 |
| 2010/0062600 A1 | 3/2010 | Utsuki | |
| 2011/0227186 A1* | 9/2011 | Chang | H01L 23/562 257/E31.124 |
| 2017/0062321 A1 | 3/2017 | Choi et al. | |

* cited by examiner

*Primary Examiner* — Amar Movva
(74) *Attorney, Agent, or Firm* — Dorsey & Whitney LLP

(57) ABSTRACT

A semiconductor device includes a semiconductor substrate having a semiconductor substrate having a main surface including a first portion; a redistribution layer provided over the first portion of the main surface of the semiconductor substrate; an insulating layer covering the first portion of the main surface of the semiconductor substrate and the redistribution layer; and a first polyimide film covering the insulating layer; wherein the polyimide film has a substantially flat upper surface.

10 Claims, 9 Drawing Sheets

SEMICONDUCTOR DEVICE AND METHOD OF FORMING THE SAME

BACKGROUND

In a semiconductor device such as dynamic random access memory (hereinafter referred to as DRAM), for example, a redistribution layer disposed in the uppermost part of the semiconductor device is thick, and therefore an unevenness reflecting the shape of the redistribution layer may be formed in some cases on the surface of a polyimide layer formed covering the upper part of the redistribution layer. Also, in the region where the redistribution layer is formed, the surface of the polyimide layer may be positioned higher than the surface of the polyimide layer in other regions in some cases.

DETAILED DESCRIPTION

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

The embodiments will be described with reference to FIGS. 1 to 12. In the following description, DRAM is given as an example of the semiconductor device.

First Embodiment

A semiconductor device 100 and a method of manufacturing the same according to the first embodiment will be described with reference to FIGS. 1 to 8.

Figure 1:
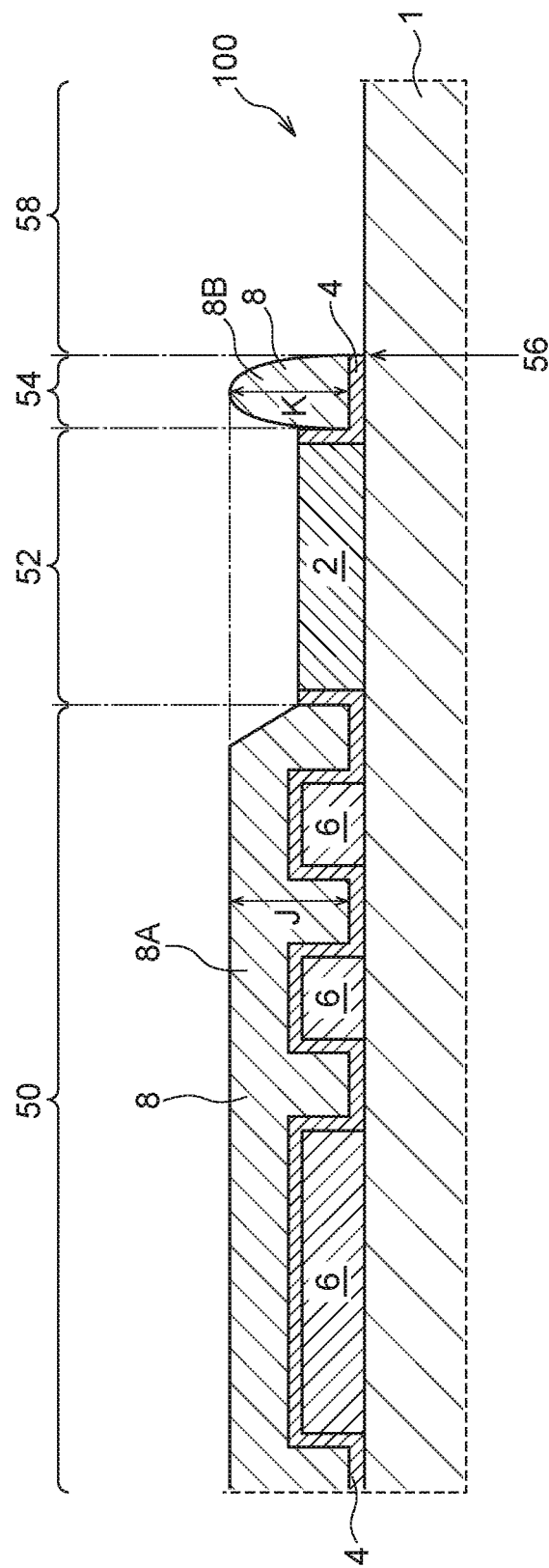
FIG. 1 is a diagram illustrating a schematic configuration of a semiconductor device and a method of manufacturing the same according to a first embodiment and a second embodiment, and is a longitudinal section illustrating one example of the schematic configuration in an exemplary process stage following FIG. 3 or FIG. 9.

As illustrated in FIG. 1, the semiconductor device 100 according to the first embodiment has a semiconductor substrate 1. The semiconductor substrate 1 has a main surface, and a bonding pad 2 and a plurality of redistribution layers 6 are disposed on the main surface. An insulating film 4 and a polyimide layer 8 are provided to cover the plurality of redistribution layers 6. The top face of the bonding pad 2 is exposed and not covered by the insulating film 4. Also, the main surface of a semiconductor substrate 1 includes a redistribution layer formation region 50, a pad formation region 52, a pad end region 54, a chip end 56, and a scribe region 58.

The redistribution layers 6 refer to interconnect layers added to redistribute terminals in a case of configuring a package with solder bumps and flip chip connections, for example. The redistribution layers 6 are normally disposed in the uppermost part of the semiconductor substrate 1. The redistribution layers 6 need low resistance values, and are therefore thick. Between the redistribution layer formation region 50 and the scribe region 58, the pad formation region 52 and the pad end region 54 are disposed from the side near the redistribution layer formation region 50. The boundary between the pad end region 54 and the scribe region 58 is the chip end 56. The pad end region 54 is disposed between the bonding pad 2 and the chip end 56.

In the semiconductor substrate 1, components such as electronic elements such as transistors and capacitors (not illustrated) that are included in DRAM, conducting interconnects (not illustrated) that electrically connect these electronic elements, and an insulating film that covers the electronic elements and interconnects are formed on a wafer of a single-crystal silicon substrate, for example. Here, the semiconductor substrate 1 provided in the semiconductor device 100 is described as including the above components.

The insulating film 4 is disposed above the semiconductor substrate 1 and the plurality of redistribution layers 6 to cover the semiconductor substrate 1 and the plurality of redistribution layers 6. The insulating film 4 is also provided on the lateral faces of the bonding pad 2. The insulating film 4 contains an insulating film material such as silicon nitride (SiN), for example. The redistribution layers 6 contain a metal such as aluminum (Al) as a conducting material, for example. The polyimide layer 8 is provided to cover the insulating film 4. The polyimide layer 8 contains a photosensitive polyimide resin.

The pad formation region 52 is a region where the bonding pad 2 used for bonding is disposed. In the pad formation region 52, the polyimide layer 8 is removed to create an opening, exposing the surface of the bonding pad 2. The bonding pad 2 is a bonding pad where bonding wires for electrically connecting the semiconductor device 100 to a control device (not illustrated) that controls the semiconductor device 100 are connected. The bonding pad 2 contains a metal such as aluminum (Al) as a conducting material, for example.

A polyimide film 8A included in the polyimide layer 8 is provided in the redistribution layer formation region 50, and has a thickness J. A polyimide film 8B included in the polyimide layer 8 is provided in the pad end region 54, and has a thickness K.

The scribe region 58 is a cutting region for cutting the semiconductor device 100 in the wafer state into individual chips. In the scribe region 58, the polyimide layer 8 is removed to create an opening, exposing the surface of the semiconductor substrate 1.

In the redistribution layer formation region 50, the polyimide film 8A has a substantially flat surface. The thickness J of the polyimide film 8A in the redistribution layer formation region 50 and the thickness K of the polyimide film 8B in the pad end region 54 are substantially the same. For this reason, the height of the polyimide film 8A in the redistribution layer formation region 50 and the height of the polyimide film 8B in the pad end region 54 are substantially the same.

Figure 2:
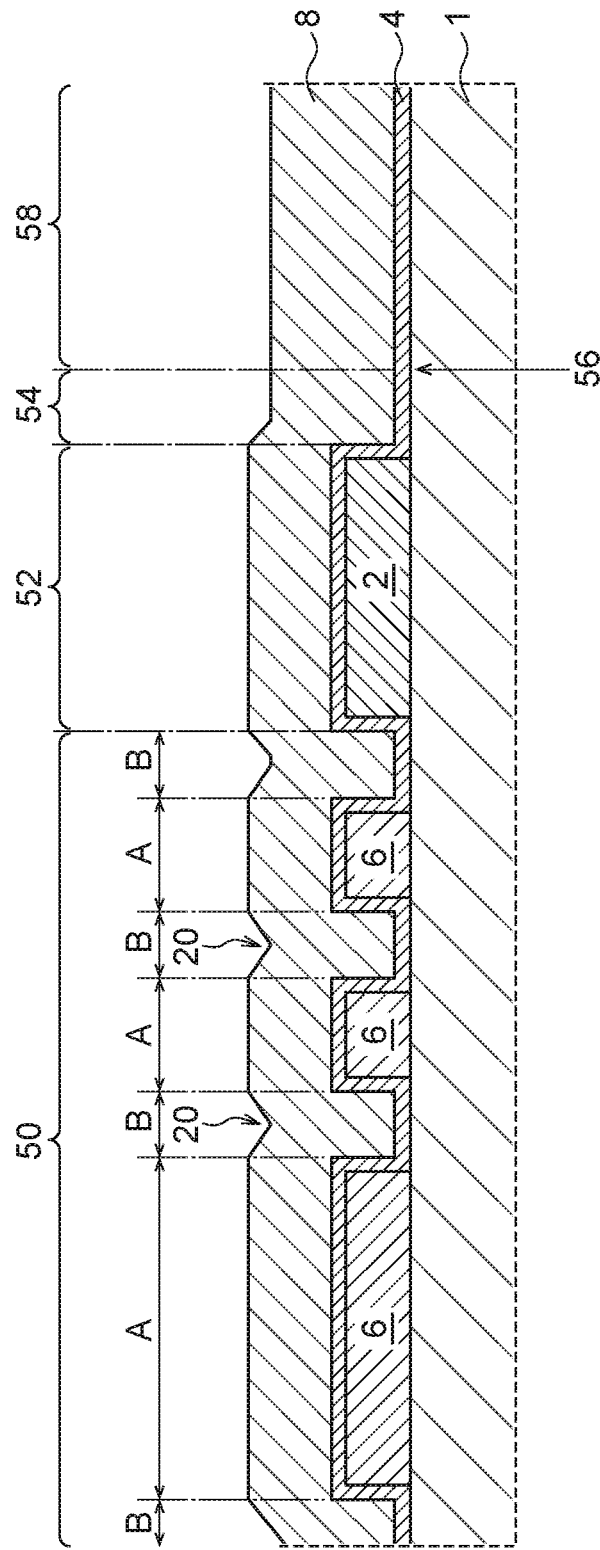
FIG. 2 is a diagram illustrating the semiconductor device and the method of manufacturing the same according to the first and second embodiments, and is a longitudinal section illustrating one example of the schematic configuration in an exemplary process stage.

Hereinafter, a method of manufacturing the semiconductor device 100 according to the first embodiment will be described. As illustrated in FIG. 2, the polyimide layer 8 covering the bonding pad 2, the plurality of redistribution layers 6, and the insulating film 4 is formed on the semiconductor substrate 1. On the upper surface of the polyimide layer 8, an unevenness reflecting the three-dimensional shape of the plurality of redistribution layers 6 is formed.

The surface of the polyimide layer 8 in the region where the redistribution layers 6 exist is protruded, and this region is referred to as the first region A described later. In the region where the redistribution layers 6 do not exist, depressions 20 are formed in the upper surface of the polyimide layer 8, and this region is referred to as the second region B.

In the redistribution layer formation region 50, the polyimide layer 8 includes the first region A as the region in which the height of the upper surface of the polyimide layer 8 is high, and the second region B as the region in which the upper surface of the polyimide layer 8 is lower than the first region A. The redistribution layers 6 exist underneath the first region A. The redistribution layers 6 do not exist underneath the second region B.

The polyimide layer 8 contains a photosensitive polyimide resin. In the first embodiment, the polyimide layer 8 contains a photosensitive polyimide resin. In the first embodiment, the polyimide layer 8 contains a positive photosensitive polyimide resin. In a positive photosensitive polyimide resin, the photosensitive polyimide in a region irradiated with light is removed by a later development process. The photosensitive polyimide in a region not irradiated with light is left behind by the later development process. In the case where the exposure dose is insufficient to completely remove the photosensitive polyimide, the thickness of the polyimide layer 8 is decreased.

The polyimide layer 8 is formed as follows. A pre-process polyimide varnish is dripped onto the semiconductor substrate 1 where the redistribution layers 6 are formed and applied by spin coating, and a softbake is performed to evaporate unwanted solvent.

Figure 3:
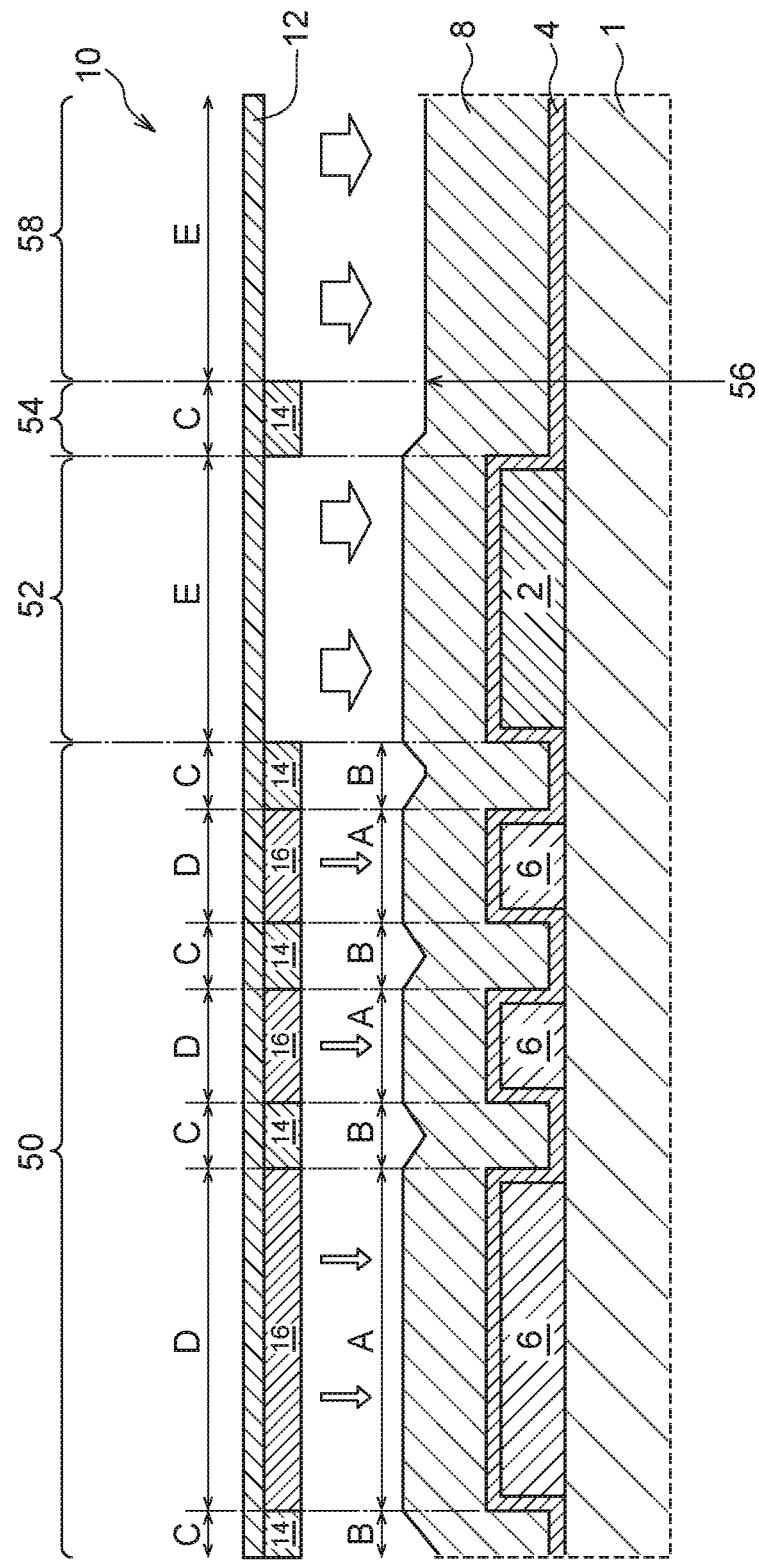
FIG. 3 is a diagram illustrating the semiconductor device and the method of manufacturing the same according to the first embodiment, is a longitudinal section illustrating one example of the schematic configuration in an exemplary process stage following FIG. 2, and is a longitudinal section illustrating a schematic configuration of a photo mask according to an embodiment disposed in correspondence with the semiconductor device.

Next, as illustrated in FIG. 3, the polyimide is patterned by performing exposure and development processes. The exposure is performed using a lithographic apparatus (not illustrated). The lithographic apparatus uses a reduction ratio of 1/5 or 1/4. The exposure is performed using a photo mask 10 on which a predetermined pattern is drawn as a photomask. Through the exposure, the pattern drawn on the photo mask 10 is transferred to the semiconductor substrate 1. The widths of the arrows illustrated in FIG. 3 diagrammatically illustrate the magnitude of the exposure doses used to irradiate the polyimide layer.

Figure 4:
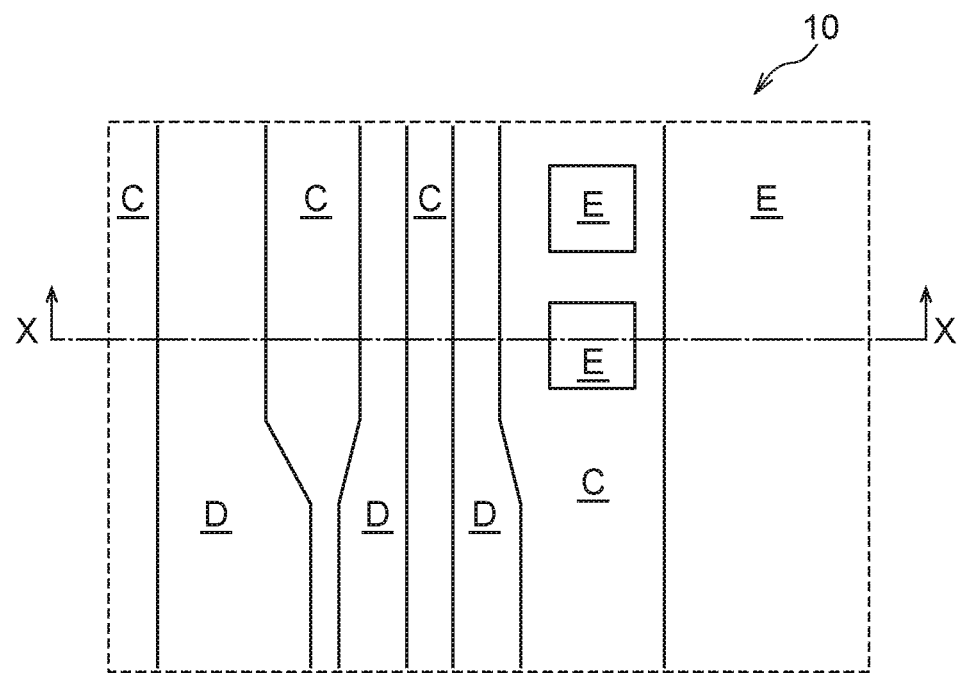
FIG. 4 is a plan view layout illustrating a schematic configuration of a photo mask according to the first embodiment.

FIG. 4 is a plan view illustrating a schematic configuration of part of the photo mask 10 used in the first embodiment. FIG. 3 illustrates a longitudinal section of the photo mask 10 and the semiconductor device 100 corresponding to the portion along the line X-X in FIG. 4. In FIG. 3, the corresponding positional relationship between the photo mask 10 and the semiconductor device 100 is illustrated. A light shading field C, a first light transmission field D, and a second light transmission field E in FIG. 4 are laid out in correspondence with the light shading field C, the first light transmission field D, and the second light transmission field E in FIG. 3. However, FIG. 3 schematically illustrates the positional relationship between the photo mask 10 and the semiconductor device 100, and in the case of using a lithographic apparatus with a reduction ratio of 1/4, for example, the photo mask 10 is actually four times the size of the pattern that is transferred to the semiconductor device 100.

The photo mask 10 is provided by stacking a light shading member 14 or a light transmission member 16 on one face of a glass substrate 12. The glass substrate 12 contains a transparent material such as quartz glass, for example. The glass substrate 12 allows light to be transmitted through with little or no reduction. The light shading member 14 contains a light shading material such as chrome oxide, for example. The transmittance of the light transmission member 16 is greater than the light shading member 14 and less than the glass substrate 12.

The photo mask 10 is provided with the light shading field C as a region where the light shading member 14 is provided, the first light transmission field D as a region where the light transmission member 16 is provided, and the second light transmission field E as a region where neither the light shading member 14 nor the light transmission member 16 is provided on one face of the glass substrate 12.

In the light shading field C, light is shaded and not transmitted. The region on the semiconductor substrate 1 corresponding to the light shading field C is not irradiated with light. In the second light transmission field E, because a member that shades light is not provided, light is transmitted without a reduction in the amount of light.

In the first light transmission field D, the light transmission member 16 that transmits a portion of the light is provided. The first light transmission field D has a higher light transmittance than the light shading field C, and a lower light transmittance than the second light transmission field E. Consequently, in the case where exposure is performed using a predetermined exposure dose, the exposure dose in the region on the semiconductor substrate 1 corresponding to the first light transmission field D is higher than the exposure dose in the region corresponding to the light shading field C, and lower than the exposure dose in the region corresponding to the second light transmission field E.

Figure 4A:
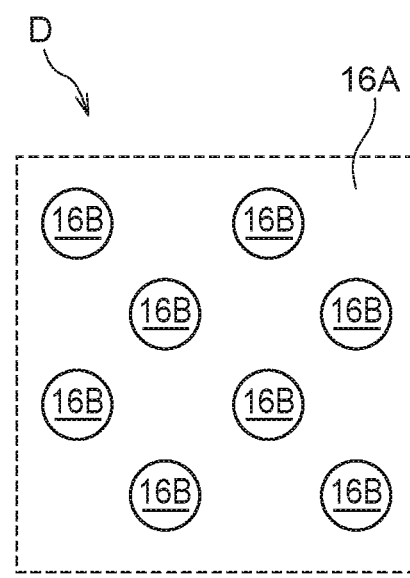
FIG. 4A is a schematic plan view illustrating an enlargement of part of the photo mask according to the first embodiment.

FIG. 4A is a plan view illustrating an enlargement of the first light transmission field D of the photo mask 10 illustrated in FIGS. 3 and 4. FIG. 4A illustrates the planar shape of the light transmission member 16. As illustrated in FIG. 4A, the light transmission member 16 in the first light transmission field D is provided with a light shading material 16A and a plurality of openings 16B. The light shading material 16A contains a light shading material such as chrome oxide, for example. The light shading material 16A is provided on one face of the glass substrate 12 in the first light transmission field D. The plurality of openings 16B penetrating the light shading material 16A are formed in the light shading material 16A. The light shading material 16A shades light while the openings 16B allow light to be transmitted.

The region provided with the light transmission member 16 configured as above acts as the first light transmission field D that transmits a portion of the light from exposure. The light transmittance in the first light transmission field D can be controlled by adjusting the area ratio between the light shading material 16A and the openings 16B of the light transmission member 16. The area ratio between the light shading material 16A and the openings 16B is adjusted according to the size and density of the light shading material 16A. The light transmittance of the light transmission member 16 is adjusted according to the planned film thickness of the polyimide layer 8 after the development process and the exposure dose when exposing the polyimide layer 8. The amount of decrease in the thickness of the polyimide layer 8 can be controlled according to the exposure dose and the light transmittance of the light transmission member 16. The exposure dose when exposing the polyimide layer 8 is set such that the polyimide layer 8 in the pad formation region 52 and the scribe region 58 is completely removed.

As illustrated in FIG. 3, the first light transmission field D of the photo mask 10 is disposed at a position corresponding to the first region A of the redistribution layer formation region 50. The light shading field C of the photo mask 10 is disposed at a position corresponding to the second region B of the redistribution layer formation region 50. The second light transmission field E of the photo mask 10 is disposed at a position corresponding to the pad formation region 52 and the scribe region 58. The light shading field C of the photo mask 10 is disposed in the pad end region 54. The photo mask 10 disposed as described above is used to perform an exposure process with respect to the polyimide layer 8 on the semiconductor substrate 1, and thereafter the development process is performed.

After that, by heating the polyimide to a curing temperature and performing an annealing process to cure the polyimide, the polyimide films 8A and 8B illustrated in FIG. 1 are formed.

The region on the semiconductor substrate 1 corresponding to the light shading field C is not irradiated with light. For this reason, the polyimide layer 8 remains in the region corresponding to the light shading field C. In this case, in the region corresponding to the light shading field C, the thickness of the polyimide layer 8 is not decreased. In the region on the semiconductor substrate 1 corresponding to the second light transmission field E, an exposure dose sufficient to completely remove the polyimide layer 8 is set. In the region corresponding to the second light transmission field E, the polyimide layer 8 is removed after development. The exposure dose in the region on the semiconductor substrate 1 corresponding to the first light transmission field D is higher than the exposure dose in the region corresponding to the light shading field C, and lower than the exposure dose in the region corresponding to the second light transmission field E. For this reason, in the region corresponding to the first light transmission field D, because the polyimide layer 8 is partially exposed, the thickness of the polyimide layer 8 is partially decreased after development.

Next, dry etching is performed using the polyimide films 8A and 8B as an etching mask, and the insulating film 4 in the pad formation region 52 and the scribe region 58 is removed. With this processing, the upper surfaces of the bonding pad 2 and the scribe region 58 are exposed.

By performing the above steps, the semiconductor device 100 illustrated in FIG. 1 can be manufactured. In the redistribution layer formation region 50 of the semiconductor device 100, the thickness of the polyimide layer 8 in the first region A is decreased to make the thickness of the polyimide layer 8 in the first region A and the second region B substantially the same. For this reason, a height difference with respect to the second region B is reduced or substantially eliminated, and a substantially flat upper surface is obtained. Also, the thickness J of the polyimide film 8A in the redistribution layer formation region 50 and the thickness K of the polyimide film 8B in the pad end region 54 are substantially the same. For this reason, the height of the top face of the redistribution layer formation region 50 and the height of the polyimide film 8B in the pad end region 54 are substantially the same.

Next, effects achieved by the semiconductor device 100 and the method of manufacturing the same according to the first embodiment will be described.

Figure 5:
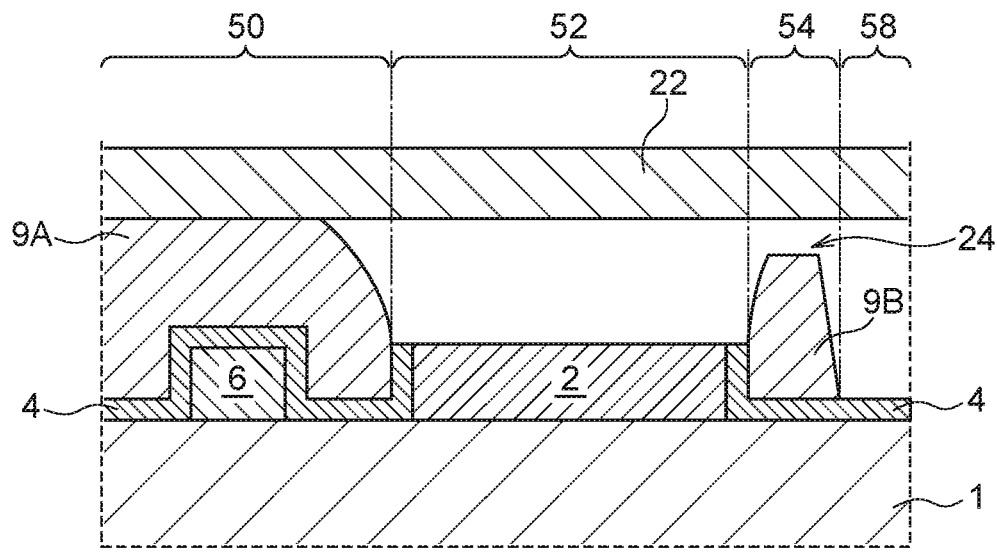
FIG. 5 is a diagram for explaining the effects of the semiconductor device and the method for manufacturing the same according to the first embodiment, and is a longitudinal section illustrating a schematic configuration of the semiconductor device in the case of not applying the first embodiment.
Figure 6:
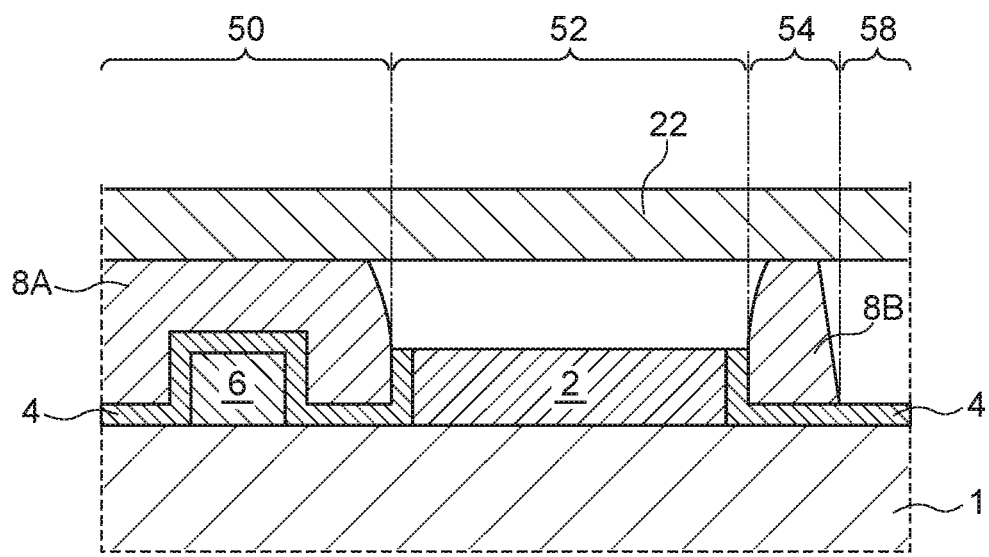
FIG. 6 is a diagram for explaining the effects of the semiconductor device and the method for manufacturing the same according to the first embodiment, and is a longitudinal section illustrating a schematic configuration of the semiconductor device according to the first embodiment in contrast with FIG. 5.
Figure 7:
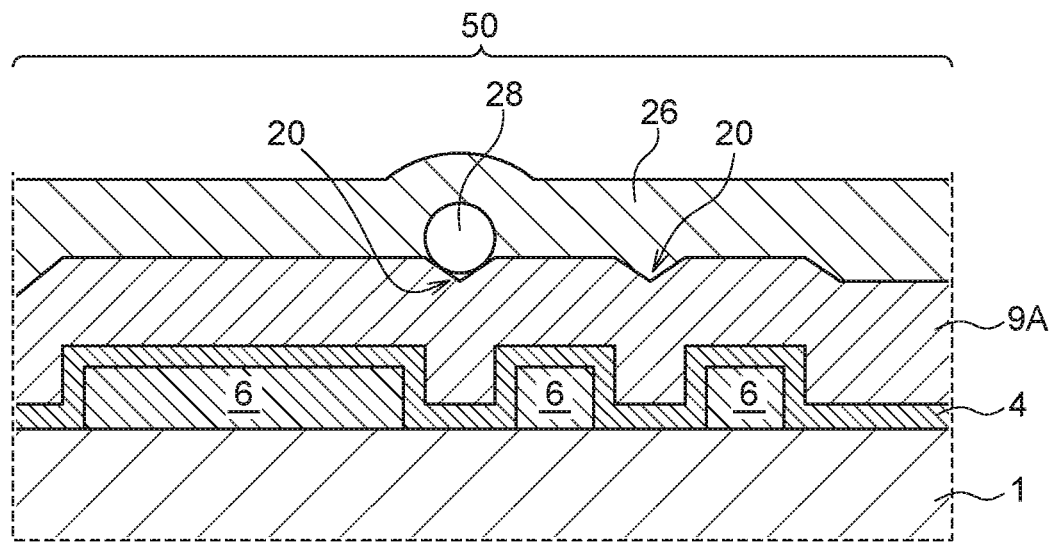
FIG. 7 is a diagram for explaining the effects of the semiconductor device and the method for manufacturing the same according to the first embodiment, and is a longitudinal section illustrating a schematic configuration of the semiconductor device in the case of not applying the first embodiment.
Figure 8:
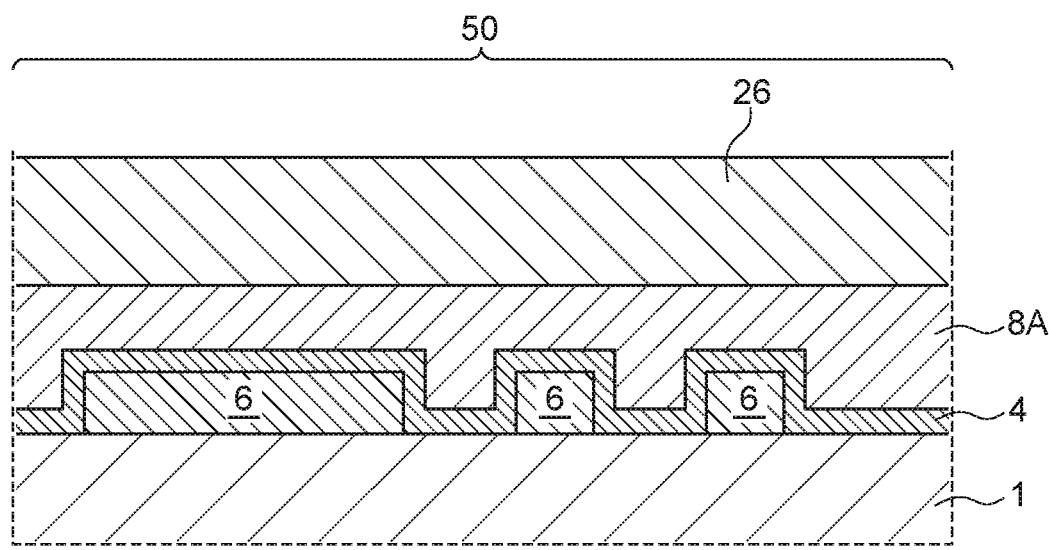
FIG. 8 is a diagram for explaining the effects of the semiconductor device and the method for manufacturing the same according to the first embodiment, and is a longitudinal section illustrating a schematic configuration of the semiconductor device according to the first embodiment in contrast with FIG. 7.

FIGS. 5 and 7 are longitudinal sections of a semiconductor device not applying the technology according to the first embodiment. FIGS. 6 and 8 are longitudinal sections illustrating a schematic configuration of the semiconductor device 100 according to the first embodiment.

First, the effect achieved by providing the polyimide film 8A in the redistribution layer formation region 50 with substantially the same thickness as the polyimide film 8B in the pad end region 54 will be described by contrasting FIGS. 5 and 6.

As illustrated in FIG. 5, in the semiconductor device not applying the technology according to the first embodiment, the heights of a polyimide film 9A in the redistribution layer formation region 50 and a polyimide film 9B in the pad end region 54 do not match, and the polyimide film 9A is higher. For this reason, in the case of applying to the surface of the semiconductor device a back grinding tape (hereinafter referred to as BG tape) 22 for protecting the surface of the semiconductor device in a back grinding step for grinding the back face to make the semiconductor device thinner, a gap 24 is formed between the polyimide film 9B and the BG tape 22. In the back grinding step, a back grinding treatment solution containing a polishing liquid or the like infiltrates the surface of the semiconductor device 100 from the gap 24. Consequently, phenomena such as corrosion of the bonding pad 2 may occur and result in a defective product. There is also a possibility of accelerated long-term deterioration of the semiconductor device.

In contrast, as illustrated in FIG. 6, in the semiconductor device 100 according to the first embodiment, the polyimide film 8A in the redistribution layer formation region 50 and the polyimide film 8B in the pad end region 54 have substantially the same thickness, and the polyimide film 8A and the polyimide film 8B are provided at substantially the same height. If the BG tape 22 is applied to the surface of the semiconductor device 100 in such a state, a gap is not formed between the polyimide film 8B and the BG tape 22. For this reason, in the back grinding step, the treatment solution does not infiltrate the surface of the semiconductor device 100. Consequently, it is possible to provide a reliable semiconductor device 100.

Next, the effect achieved by not forming an unevenness on the upper surface of the polyimide film 8A in the redistribution layer formation region 50 will be described by contrasting FIGS. 7 and 8.

As illustrated in FIG. 7, in the semiconductor device not applying the technology according to the first embodiment, depressions 20 are formed in the upper surface of the polyimide film 9A disposed in the redistribution layer formation region 50. A die attach film (hereinafter referred to as DAF) 26 is applied on top of the polyimide film 9A. The DAF 26 is obtained by providing a die bonding adhesive on the sticky side of dicing tape, for example, and has a function of binding semiconductor chips together when stacking a plurality of semiconductor devices to assemble a chip-on-chip package. For example, in DRAM for mobile applications, the product wafer is shipped in a state in which the redistribution layer is encapsulated by a polyimide layer that acts as a passivation layer. Thereafter, at a downstream process facility, the wafer is subjected to back grinding and then assembled into a desired package. During this assembly, the DAF 26 is used for purposes such as raising the adhesion with the mold resin of the package.

As illustrated in FIG. 7, in the semiconductor device not applying the technology according to the first embodiment, depressions 20 are formed in the upper surface of the polyimide film 9A in the redistribution layer formation region 50. For this reason, when applying the DAF 26 to the surface of the polyimide film 9A, air bubbles are caught in between the polyimide film 9A and the DAF 26 and become pooled in one of the depressions 20, thereby forming a void 28. In some cases, moisture is mixed in together with air in the void 28. If the semiconductor device 100 is assembled into a laminated package with the void 28 included, there is a possibility that the void 28 will burst when the temperature later rises due to a thermal load or the like.

In contrast, in the semiconductor device 100 according to the first embodiment, the upper surface of the polyimide film 8A is substantially flat, and virtually no depressions 20 exist. When the DAF 26 is applied to the surface of such a polyimide film 8A, because virtually no depressions 20 exist, trapped air does not become pooled, and the formation of the void 28 is suppressed.

According to the semiconductor device 100 and the method for manufacturing the same according to the first embodiment described above, the following effects are exhibited.

In the semiconductor device 100 and the method for manufacturing the same according to the first embodiment, because virtually no depressions exist, the surface of the polyimide film 8A in the redistribution layer formation region 50 is a substantially flat surface. Consequently, the formation of the void 28 between the polyimide film 8A and the DAF 26 is suppressed, and therefore the void 28 does not burst in cases where the temperature rises due to a thermal load or the like. Accordingly, the semiconductor device 100 with improved reliability can be provided.

Also, it is possible to make the thickness of the polyimide film 8A in the redistribution layer formation region 50 and the thickness of the polyimide film 8B in the pad end region 54 substantially the same. For this reason, it is possible to make the height of the polyimide film 8A in the redistribution layer formation region 50 and the height of the polyimide film 8B in the pad end region 54 substantially the same height. With this arrangement, in the case of applying the BG tape 22 to the surface of the semiconductor device 100, the gap 24 is not formed between the polyimide film 8B and the BG tape 22. Accordingly, in the back grinding step, the treatment solution does not infiltrate the surface of the semiconductor device 100. Consequently, it is possible to provide a reliable semiconductor device 100.

Second Embodiment

Next, a semiconductor device 100 and a method of manufacturing the same according to the second embodiment will be described with reference to FIGS. 1, 2, 9, 10, and 10A.

First, the steps described using FIG. 2 of the first embodiment are performed.

Figure 9:
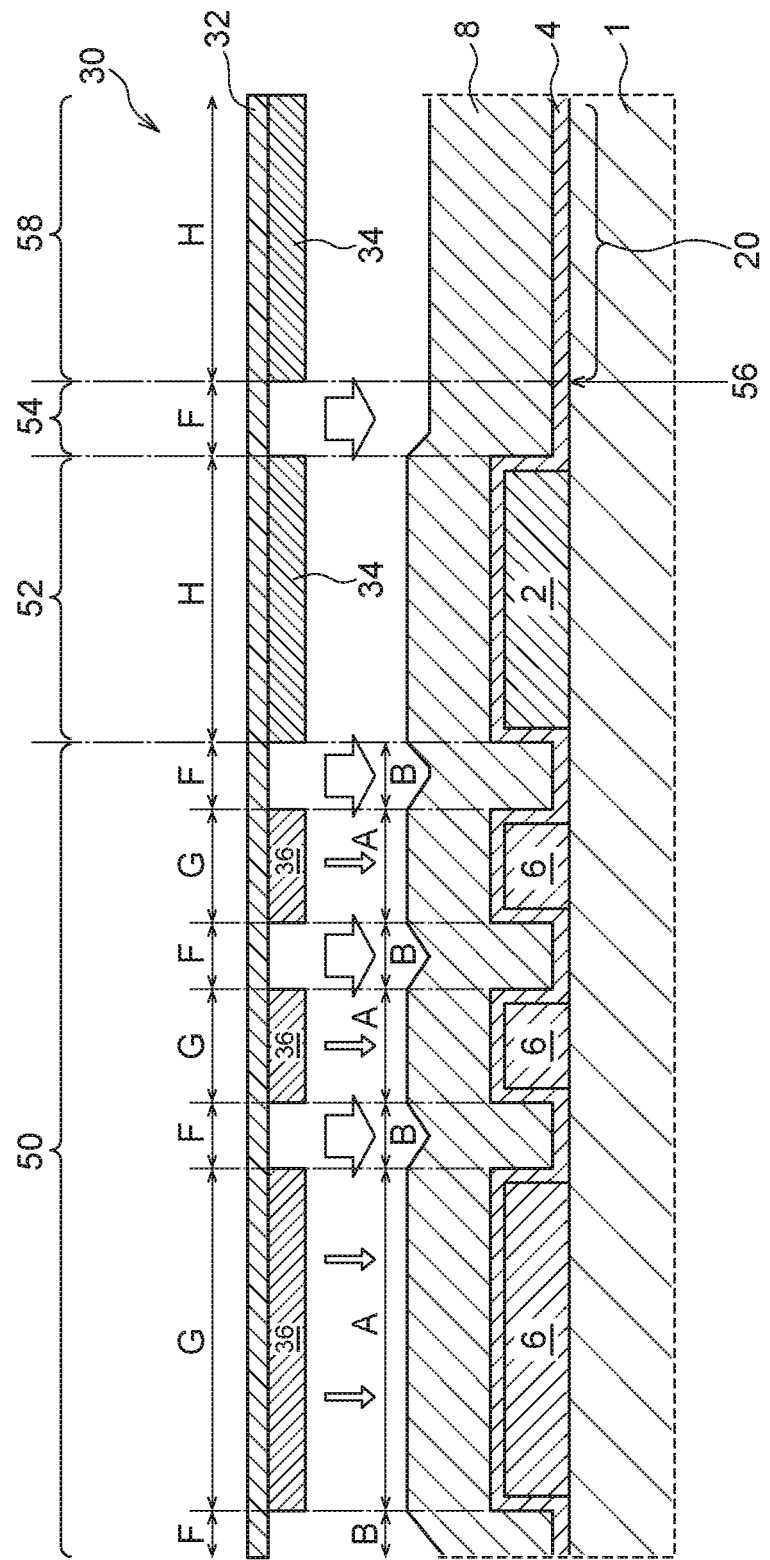
FIG. 9 is a diagram illustrating the method of manufacturing the semiconductor device according to the second embodiment, is a longitudinal section illustrating one example of the schematic configuration in an exemplary process stage following FIG. 2, and is a longitudinal section illustrating a schematic configuration of a photo mask according to an embodiment disposed in correspondence with the semiconductor device.

Next, as illustrated in FIG. 9, the polyimide is patterned by performing exposure and development processes. The exposure is performed using a lithographic apparatus (not illustrated). The lithographic apparatus uses a reduction ratio of 1/5 or 1/4. The exposure is performed using a photo mask 30 on which a predetermined pattern is drawn as a photomask. Through the exposure, the pattern drawn on the photo mask 30 is transferred to the semiconductor substrate 1.

The polyimide layer 8 illustrated in FIG. 9 contains a negative photosensitive polyimide resin. With a negative photosensitive polyimide resin, in the portion irradiated with light by exposure, the polyimide layer 8 is left behind without being removed after development. In the portion not irradiated with light, the polyimide layer 8 is removed after development. In a portion with a low exposure dose, the thickness of the portion is decreased after development.

Figure 10:
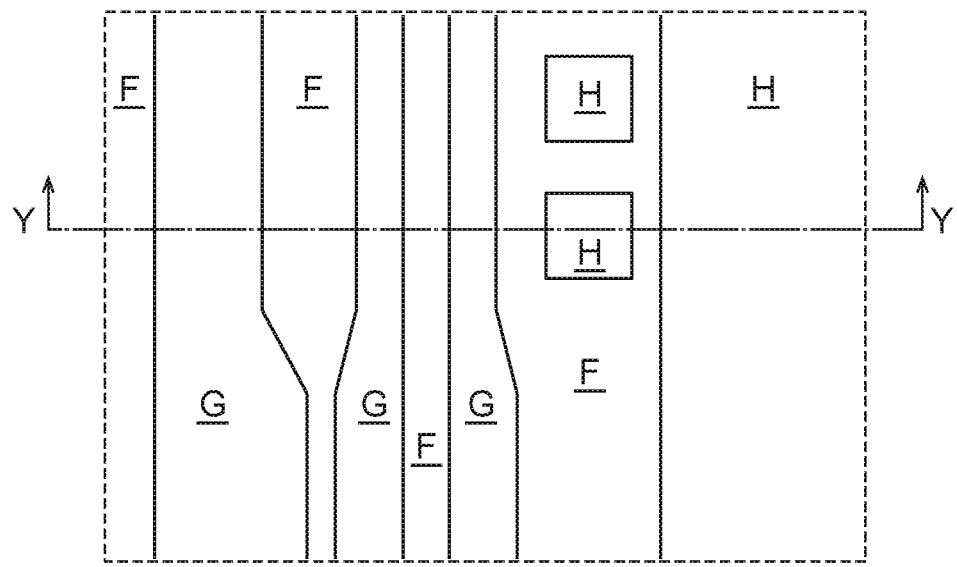
FIG. 10 is a plan view layout illustrating a schematic configuration of a photo mask according to the second embodiment.

FIG. 10 is a plan view illustrating a schematic configuration of part of the photo mask 30 used in the second embodiment. FIG. 9 illustrates a longitudinal section of the photo mask 30 and the semiconductor device 100 corresponding to the portion along the line Y-Y in FIG. 10. In FIG. 9, the corresponding positional relationship between the photo mask 30 and the semiconductor device 100 is illustrated. A light shading field H, a first light transmission field G, and a second light transmission field F in FIG. 10 are laid out in correspondence with the light shading field H, the first light transmission field G, and the second light transmission field F in FIG. 9. However, FIG. 9 schematically illustrates the positional relationship between the photo mask 30 and the semiconductor device 100, and in the case of using a lithographic apparatus with a reduction ratio of 1/4, for example, the photo mask 30 is four times the size of the pattern that is transferred to the semiconductor device 100.

The photo mask 30 is provided by stacking a light shading member 34 or a light transmission member 36 on one face of a glass substrate 32. The glass substrate 32 contains a transparent material such as quartz glass, for example. The light shading member 34 contains a light shading material such as chrome oxide, for example. The light transmittance of the light transmission member 36 is greater the light shading member 34 and less than the glass substrate 32.

The photo mask 30 is provided with the light shading field H as a region where the light shading member 34 is provided, the first light transmission field G as a region where the light transmission member 36 is provided, and the second light transmission field F as a region where neither the light shading member 34 nor the light transmission member 36 is provided on one face of the glass substrate 32.

In the light shading field H, light is shaded by the light shading member 34 and not transmitted. The region on the semiconductor substrate 1 corresponding to the light shading field H is not irradiated with light. Because the second light transmission field F is not provided with a member that shades light or a member that reduces light, light is transmitted without a substantial reduction.

In the first light transmission field G, the light transmission member 36 that transmits a portion of the light is provided. The first light transmission field G has a higher light transmittance than the light shading field H, and a lower light transmittance than the second light transmission field F. Consequently, in the case where exposure is performed using a predetermined exposure dose, the exposure dose in the region on the semiconductor substrate 1 corresponding to the first light transmission field G is higher than the exposure dose in the region corresponding to the light shading field H, and lower than the exposure dose in the region corresponding to the second light transmission field F.

Figure 10A:
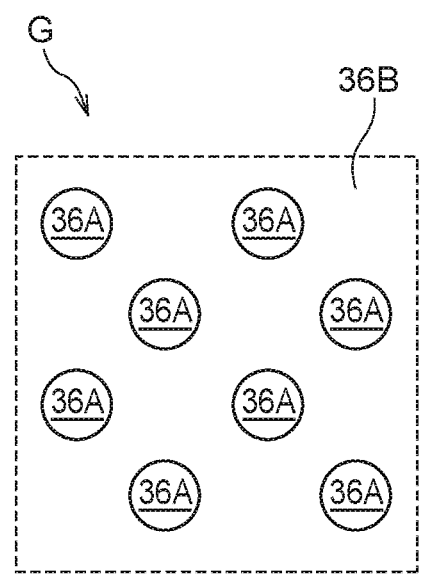
FIG. 10A is a schematic plan view illustrating an enlargement of part of the photo mask according to the second embodiment.

FIG. 10A is a plan view illustrating an enlargement of the first light transmission field G of the photo mask 30 illustrated in FIGS. 9 and 10. FIG. 10A illustrates the planar shape of the light transmission member 36. As illustrated in FIG. 10A, the light transmission member 36 in the first light transmission field G is provided with a light shading material 36A and openings 36B. The light shading material 36A contains a light shading material such as chrome oxide, for example. The light shading material 36A is provided on one face of the glass substrate 32. The openings 36B are regions where the light shading material is not formed. In the openings 36B, light can be transmitted without being substantially reduced.

The region provided with the light transmission member 36 configured as above acts as the first light transmission field G capable of transmitting a portion of the light from exposure. The light transmittance in the first light transmission field G can be controlled by adjusting the area ratio between the light shading material 36A and the openings 36B. The area ratio can be controlled by adjusting the size and density of the light shading material 36A. The light transmittance of the light transmission member 36 is adjusted according to the planned film thickness of the polyimide layer 8 after the exposure and development processes and the exposure dose when exposing the polyimide layer 8. The amount of decrease in the thickness of the polyimide layer 8 can be controlled according to the exposure dose and the light transmittance of the light transmission member 36. The exposure dose when exposing the polyimide layer 8 is set such that the height of the polyimide layer 8 in the redistribution layer formation region 50 and the height of the polyimide layer 8 in the pad end region 54 are substantially the same.

As illustrated in FIG. 9, the first light transmission field G of the photo mask 30 is disposed at a position corresponding to the first region A of the redistribution layer formation region 50. The second light transmission field F of the photo mask 30 is disposed at a position corresponding to the second region B of the redistribution layer formation region 50. The light shading field H of the photo mask 30 is disposed at a position corresponding to the pad formation region 52 and the scribe region 58. The second light transmission field F of the photo mask 30 is disposed in the pad end region 54.

The photo mask 30 disposed as described above is used to perform an exposure process with respect to the polyimide layer 8 on the semiconductor substrate 1, and thereafter the development process is performed. The widths of the arrows illustrated in FIG. 9 diagrammatically illustrate the magnitude of the exposure doses used to irradiate the polyimide layer. After that, by heating the polyimide to a curing temperature and performing an annealing process to cure the polyimide, the polyimide films 8A and 8B illustrated in FIG. 1 are formed.

The region on the semiconductor substrate 1 corresponding to the light shading field H is not irradiated with light. For this reason, the polyimide layer 8 is removed in the region corresponding to the light shading field H. The exposure dose is higher in the region on the semiconductor substrate 1 corresponding to the second light transmission field F. Because the polyimide layer 8 is sufficiently exposed in the region corresponding to the second light transmission field F, the polyimide layer 8 is left behind without a decrease in thickness. The exposure dose in the region on the semiconductor substrate 1 corresponding to the first light transmission field G is higher than the exposure dose in the region corresponding to the light shading field H, and lower than the exposure dose in the region corresponding to the second light transmission field F. For this reason, in the first region A corresponding to the first light transmission field G, because the polyimide layer 8 is partially exposed, the thickness of the polyimide layer 8 is partially decreased after development.

Next, dry etching is performed using the polyimide films 8A and 8B as an etching mask, and the insulating film 4 in the pad formation region 52 and the scribe region 58 is removed. With this arrangement, the upper surfaces of the bonding pad 2 and the scribe region 58 are exposed.

By performing the above steps, the semiconductor device 100 illustrated in FIG. 1 can be manufactured. According to the semiconductor device 100 and the method of manufacturing the same according to the second embodiment, effects similar to the first embodiment are obtained.

The photo masks 10 and 30 used in the first and second embodiments described above can be modified as follows.

Figure 11:
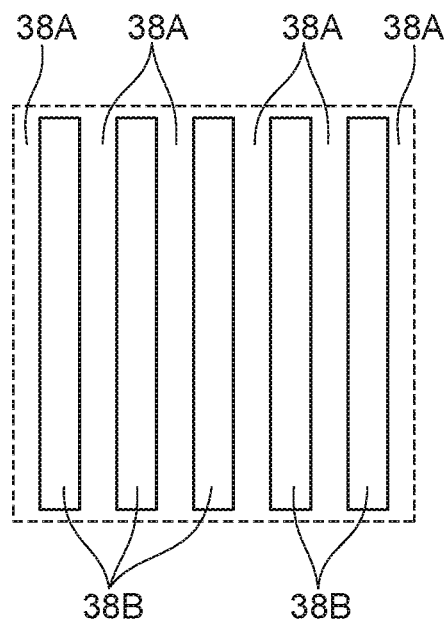
FIG. 11 is a plan view schematically illustrating a first modification of the photo mask.

As illustrated in FIG. 11, the light transmission member 16 of the first light transmission field D of the photo mask 10 and the light transmission member 36 of the first light transmission field G of the photo mask 30 may also be provided with slits 38B. The light shading material 38A contains a light shading material that does not allow light to be transmitted, such as chrome oxide, for example. The slits 38B are openings where the light shading material contained in the light shading material 38A is not formed, and are a portion where light is transmitted. The light transmittance can be controlled by adjusting the area ratio between the light shading material 36A and the slits 38B. The area ratio can be set by adjusting properties such as the width and spacing of the slits 38B.

Figure 12:
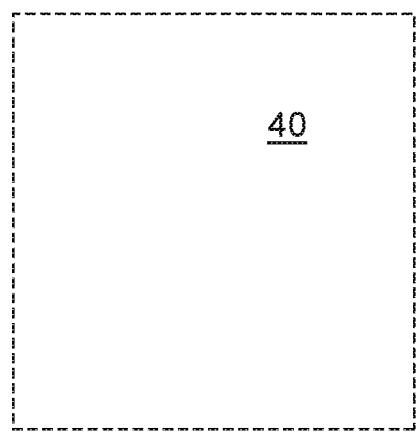
FIG. 12 is a plan view schematically illustrating a second modification of the photo mask.

Additionally, as illustrated in FIG. 12, the light transmission member 16 of the first light transmission field D of the photo mask 10 and the light transmission member 36 of the first light transmission field G of the photo mask 30 may include a halftone material 40. The halftone material 40 is a semi-transparent film. For example, a material containing molybdenum (Mo), chrome (Cr), silicon (Si), and nitrogen (N) or the like can be used as the halftone material 40. Light passing through the halftone 40 is reduced. The light transmittance of the halftone material 40 can be controlled by adjusting properties such as the composition ratio of the materials contained in the halftone material 40 and the thickness of the halftone material 40.

As above, DRAM is described as an example of the semiconductor device 100 according to various embodiments, but the above description is merely one example and not intended to be limited to DRAM. Memory devices other than DRAM, such as static random-access memory (SRAM), flash memory, erasable programmable read-only memory (EPROM), magnetoresistive random-access memory (MRAM), and phase-change memory for example can also be applied as the semiconductor device 100. Furthermore, devices other than memory, including logic ICs such as a microprocessor and an application-specific integrated circuit (ASIC) for example are also applicable as the semiconductor device 100 according to the foregoing embodiments.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

The invention claimed is:

1. A semiconductor device comprising:
a semiconductor substrate having a main surface including a first region, a second region adjacent to the first region, and a third region separated from the first region;
a redistribution layer provided partially on the first region of the main surface of the semiconductor substrate;
a first portion of an insulating layer covering the first region of the main surface of the semiconductor substrate and the redistribution layer; and
a first polyimide film covering the first portion of the insulating layer;
a bonding pad exposed in the second region of the main surface by an opening, the opening including a surface of the first polyimide film;
a second portion of the insulating layer provided on the third region; and
a second polyimide film covering the second portion of the insulating layer,
wherein the first polyimide film has a substantially flat upper surface,
wherein the first polyimide film and the second polyimide film have substantially same thickness,
wherein a first lateral surface of the bonding pad is directly covered by a third portion of the insulating layer, the third portion of the insulating layer being adjacent to the first polyimide film and the first portion of the insulating layer,
wherein a second lateral surface of the bonding pad is directly covered by a fourth portion of the insulating layer, the fourth portion of the insulating layer being adjacent to the second polyimide film and the second portion of the insulating layer, and
wherein the first lateral surface and the second lateral surface of the bonding pad are perpendicular to a top surface of the bonding pad, wherein an entirety of the top surface of the bonding pad is exposed by the insulating layer.

2. The semiconductor device of claim 1, wherein the second region is positioned between the first and third regions.

3. The semiconductor device of claim 1, wherein the first and second polyimide films include a positive photosensitive polyimide resin.

4. The semiconductor device of claim 1, wherein the first and second polyimide films include a negative photosensitive polyimide resin.

5. The semiconductor device of claim 1, wherein the redistribution layer includes a metal.

6. A semiconductor device comprising:
a redistribution layer provided over the semiconductor substrate;
a bonding pad provided over the semiconductor substrate;
a redistribution layer formation region where the redistribution layer is formed;
a chip end;
a pad end region arranged between the bonding pad and the chip end;
a first polyimide film provided over the redistribution layer formation region so as to cover the semiconductor substrate and the redistribution layer; and
a second polyimide film disposed in the pad end region;
wherein the first polyimide film has a substantially flat upper surface,
wherein the bonding pad is disposed on the semiconductor substrate and is exposed adjacent to the redistribution layer formation region,
wherein the first polyimide film and the second polyimide film have substantially same thickness,
wherein a lower edge of the surface of the first polyimide film is in the same plane as a top surface of the bonding pad,
wherein lateral surfaces of the bonding pad that are perpendicular to the top surface of the bonding pad are covered by an insulating material, and
wherein an entirety of the top surface of the bonding pad is exposed by the insulating material.

7. The semiconductor device of claim 6, wherein the first polyimide film and the second polyimide film include a positive photosensitive polyimide resin.

8. The semiconductor device of claim 6, wherein the first polyimide film and the second polyimide film include a negative photosensitive polyimide resin.

9. The semiconductor device of claim 6, wherein the redistribution layer includes a metal.

10. A semiconductor device comprising:
- a semiconductor substrate having a main surface including a first region, a second region adjacent to the first region, and a third region separated from the first region;
- a redistribution layer provided partially on the first region of the main surface of the semiconductor substrate;
- a first portion of an insulating layer covering the first region of the main surface of the semiconductor substrate and the redistribution layer; and
- a first polyimide film covering the first portion of the insulating layer;
- a bonding pad exposed in the second region of the main surface by an opening, the opening including a surface of the first polyimide film;
- a second portion of the insulating layer provided on the third region; and
- a second polyimide film covering the second portion of the insulating layer,
- wherein the first polyimide film has a substantially flat upper surface,
- wherein the first polyimide film and the second polyimide film have substantially same thickness,
- wherein a first lateral surface of the bonding pad is directly covered by a third portion of the insulating layer, the third portion of the insulating layer being adjacent to the first polyimide film and the first portion of the insulating layer,
- wherein a second lateral surface of the bonding pad is directly covered by a fourth portion of the insulating layer, the fourth portion of the insulating layer being adjacent to the second polyimide film and the second portion of the insulating layer, and
- wherein a lower edge of the surface of the first polyimide film of the opening is in the same plane as a top surface of the bonding pad, and wherein the top surface of the bonding pad is flush with the second portion of the insulating layer covering the second region of the main surface of the semiconductor substrate.

* * * * *